United States Patent
Ouchi

(10) Patent No.: US 12,531,540 B2
(45) Date of Patent: Jan. 20, 2026

(54) ACOUSTIC WAVE DEVICE

(71) Applicant: Murata Manufacturing Co., Ltd., Nagaokakyo (JP)

(72) Inventor: Minefumi Ouchi, Nagaokakyo (JP)

(73) Assignee: MURATA MANUFACUTURING CO., LTD., Kyoto (JP)

(*) Notice: Subject to any disclaimer, the term of this patent is extended or adjusted under 35 U.S.C. 154(b) by 595 days.

(21) Appl. No.: 17/975,841

(22) Filed: Oct. 28, 2022

(65) Prior Publication Data
US 2023/0049616 A1 Feb. 16, 2023

Related U.S. Application Data

(63) Continuation of application No. PCT/JP2021/017233, filed on Apr. 30, 2021.

(30) Foreign Application Priority Data

Apr. 30, 2020 (JP) .................. 2020-080474

(51) Int. Cl.
*H03H 9/17* (2006.01)
*H03H 9/13* (2006.01)

(52) U.S. Cl.
CPC .............. *H03H 9/17* (2013.01); *H03H 9/13* (2013.01)

(58) Field of Classification Search
CPC .. H03H 9/02; H03H 9/02062; H03H 9/02157; H03H 9/02228
USPC ........................................................ 333/187
See application file for complete search history.

(56) References Cited

U.S. PATENT DOCUMENTS

| | | |
|---|---|---|
| 2009/0231061 A1 | 9/2009 | Tanaka |
| 2010/0223999 A1 | 9/2010 | Onoe |
| 2012/0286900 A1 | 11/2012 | Kadota et al. |
| 2013/0057360 A1 | 3/2013 | Meltaus et al. |

(Continued)

FOREIGN PATENT DOCUMENTS

| | | |
|---|---|---|
| JP | 2002368576 A | 12/2002 |
| JP | 2009246943 A | 10/2009 |

(Continued)

OTHER PUBLICATIONS

International Search Report in PCT/JP2021/017233, mailed Jul. 13, 2021, 4 pages.

(Continued)

*Primary Examiner* — Andrea Lindgren Baltzell
*Assistant Examiner* — Victor Cole
(74) *Attorney, Agent, or Firm* — Keating & Bennett, LLP

(57) ABSTRACT

An acoustic wave device includes a piezoelectric layer and first and second electrodes. The piezoelectric layer is made of lithium niobate or lithium tantalate. The first electrode and the second electrode oppose each other in a direction intersecting with a thickness direction of the piezoelectric layer. The first electrode and the second electrode are electrodes adjacent to each other. d/p is about 0.5 or smaller, where d is a thickness of the piezoelectric layer and p is a center-to-center distance between the first electrode and the second electrode. An intersecting width is about 4.6 p or greater. The intersecting width is a dimension of a region where the first electrode and the second electrode oppose each other. The direction of the dimension is an extending direction of the first electrode and the second electrode.

20 Claims, 10 Drawing Sheets

(56) References Cited

U.S. PATENT DOCUMENTS

| | | | |
|---|---|---|---|
| 2019/0379353 | A1 | 12/2019 | Nakahashi |
| 2019/0386637 | A1* | 12/2019 | Plesski ............... H03H 9/02015 |
| 2020/0295730 | A1 | 9/2020 | Nagatomo et al. |
| 2022/0216842 | A1 | 7/2022 | Nagatomo et al. |

FOREIGN PATENT DOCUMENTS

| | | | |
|---|---|---|---|
| JP | 2010233210 | A | 10/2010 |
| JP | 2012257019 | A | 12/2012 |
| JP | 2013528996 | A | 7/2013 |
| WO | 2011093449 | A1 | 8/2011 |
| WO | 2018168503 | A1 | 9/2018 |
| WO | 2019111664 | A1 | 6/2019 |
| WO | 2021060523 | A1 | 4/2021 |

OTHER PUBLICATIONS

Written Opinion in PCT/JP2021/017233, mailed Jul. 13, 2021, 5 pages.

* cited by examiner

ACOUSTIC WAVE DEVICE

CROSS REFERENCE TO RELATED APPLICATIONS

This application claims the benefit of priority to Japanese Patent Application No. 2020-080474, filed on Apr. 30, 2020, and is a Continuation Application of PCT Application No. PCT/JP2021/017233, filed on Apr. 30, 2021. The entire contents of each application are hereby incorporated herein by reference.

BACKGROUND OF THE INVENTION

1. Field of the Invention

The present invention relates to an acoustic wave device including a piezoelectric layer made of lithium niobate or lithium tantalate.

2. Description of the Related Art

Hitherto, an acoustic wave device which utilizes Lamb waves propagating through a piezoelectric film made of $LiNbO_3$ or $LiTaO_3$ is known. For example, Japanese Unexamined Patent Application Publication No. 2012-257019 discloses an acoustic wave device utilizing Lamb waves. In this acoustic wave device, an IDT electrode is disposed on the top surface of a piezoelectric film made of $LiNbO_3$ or $LiTaO_3$. A voltage is applied to between plural electrode fingers connected to one potential of the IDT electrode and plural electrode fingers connected to the other potential. This excites Lamb waves. A reflector is disposed on each side of the IDT electrode. With this configuration, an acoustic wave resonator utilizing Lamb waves is formed.

One of the approaches to miniaturize the acoustic wave device disclosed in Japanese Unexamined Patent Application Publication No. 2012-257019 may be reducing the number of electrode fingers. However, if the number of electrode fingers is reduced, the Q factor is decreased.

It is also desirable that an acoustic wave device does not easily respond to unwanted waves other than to the main mode to be utilized.

SUMMARY OF THE INVENTION

Preferred embodiments of the present invention provide acoustic wave devices that are each able to improve the Q factor even if the size of the acoustic wave device is reduced and also to reduce or prevent ripples caused by unwanted waves.

An acoustic wave device according to a preferred embodiment of the present invention includes a piezoelectric layer and first and second electrodes. The piezoelectric layer is made of lithium niobate or lithium tantalate. The first electrode and the second electrode oppose each other in a direction intersecting with a thickness direction of the piezoelectric layer. The acoustic wave device utilizes a bulk wave of a thickness shear mode. An intersecting width is about 4.6 p or greater, where p is a center-to-center distance between the first electrode and the second electrode. The intersecting width is a dimension of a region where the first electrode and the second electrode oppose each other. The direction of the dimension is an extending direction of the first and second electrodes.

A acoustic wave device according to a preferred embodiment of the present invention includes a piezoelectric layer and first and second electrodes. The piezoelectric layer is made of lithium niobate or lithium tantalate. The first electrode and the second electrode oppose each other in a direction intersecting with a thickness direction of the piezoelectric layer. The first electrode and the second electrode are electrodes adjacent to each other. d/p is about 0.5 or smaller, where d is a thickness of the piezoelectric layer and p is a center-to-center distance between the first electrode and the second electrode. An intersecting width is about 4.6 p or greater. The intersecting width is a dimension of a region where the first electrode and the second electrode oppose each other. The direction of the dimension is an extending direction of the first and second electrodes.

Acoustic wave devices according to preferred embodiments of the present invention are able to improve the Q factor even if the size of the acoustic wave device is reduced and also to reduce or prevent ripples caused by unwanted waves.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be described below through illustration of preferred embodiments with reference to the drawings.

The preferred embodiments described in the specification are only examples. The configurations described in different preferred embodiments may partially be replaced by or combined with each other.

First and second preferred embodiments of the present invention each include a piezoelectric layer and first and second electrodes. The piezoelectric layer is made of lithium niobate or lithium tantalate. The first and second electrodes oppose each other in a direction intersecting with a thickness direction of the piezoelectric layer.

In the first preferred embodiment, bulk waves of the thickness shear mode are utilized. In the second preferred embodiment, the first and second electrodes are electrodes adjacent to each other.

d/p is preferably set to be, for example, about 0.5 or smaller, where d is the thickness of the piezoelectric layer and p is the center-to-center distance between the first and second electrodes. With this configuration, in the first and second inventions, even if the size of the acoustic wave device is reduced, the Q factor can be improved.

Figure 1A:
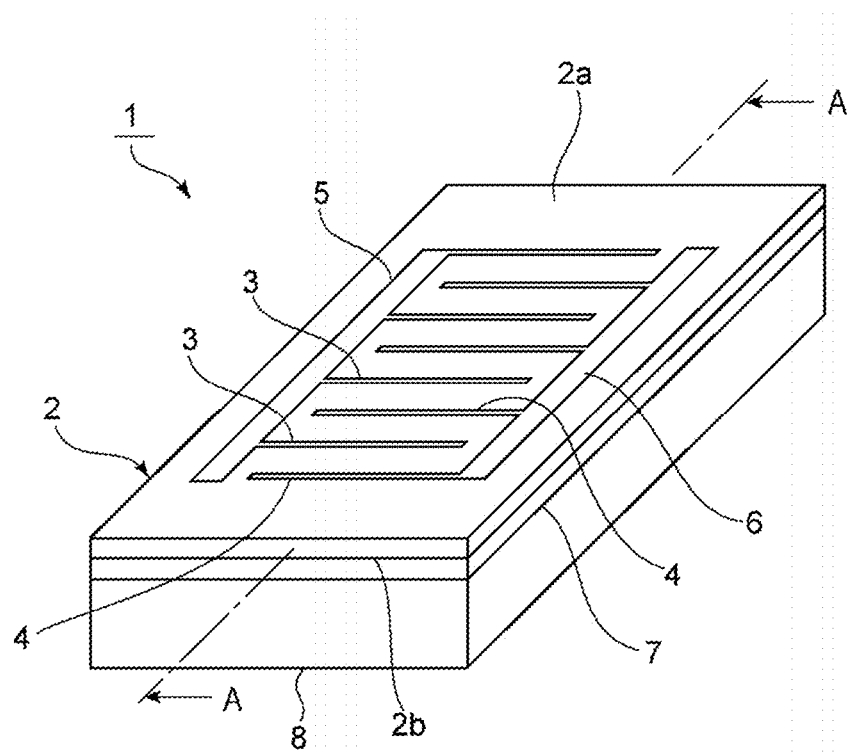
FIG. 1A is a schematic perspective view illustrating the external appearance of an acoustic wave device according to a first preferred embodiment of the invention.
Figure 1B:
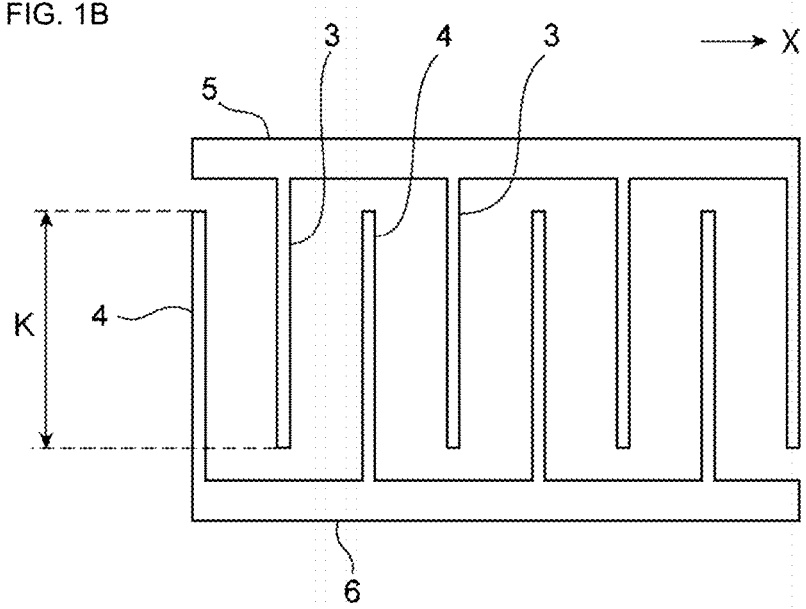
FIG. 1B is a plan view illustrating the electrode structure on a piezoelectric layer of the acoustic wave device.
Figure 2:
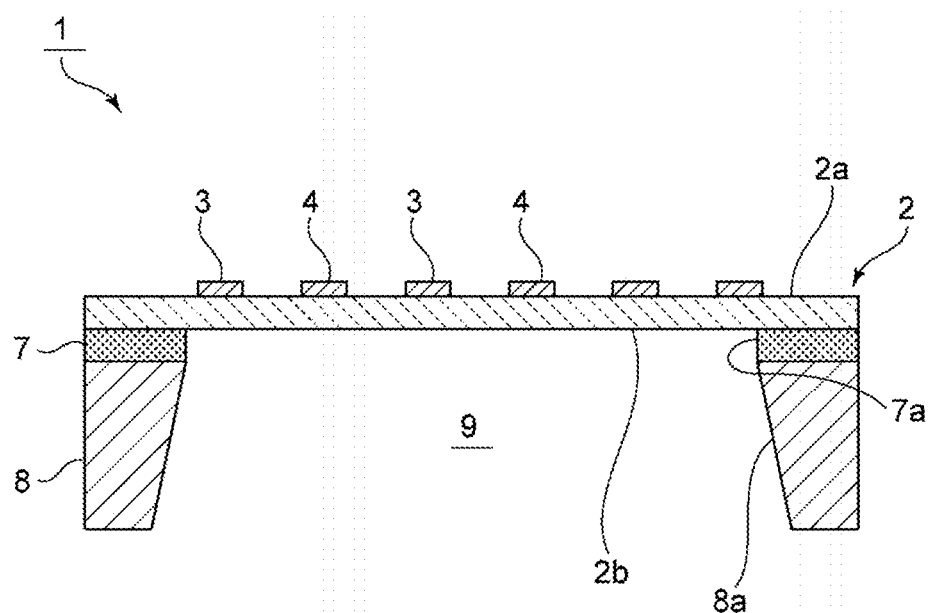
FIG. 2 is a sectional view taken along line A-A in FIG. 1A.

FIG. 1A is a schematic perspective view illustrating the external appearance of an acoustic wave device according to a first preferred embodiment of the present invention. FIG. 1B is a plan view illustrating the electrode structure on a piezoelectric layer of the acoustic wave device. FIG. 2 is a sectional view taken along line A-A in FIG. 1A.

An acoustic wave device 1 includes a piezoelectric layer 2 made of, for example, LiNbO$_3$, which is lithium niobate. The piezoelectric layer 2 may be made of, for example, LiTaO$_3$, which is lithium tantalate. Regarding the cut angles of LiNbO$_3$ or LiTaO$_3$ in the present preferred embodiment, Z-cut LiNbO$_3$ or LiTaO$_3$ is used, but rotated Y-cut or X-cut LiNbO$_3$ or LiTaO$_3$ may be used. Although the thickness of the piezoelectric layer 2 is not restricted to a particular thickness, it is preferably, for example, about 40 nm to about 1000 nm to effectively excite the thickness shear mode.

The piezoelectric layer 2 includes first and second main surfaces 2a and 2b opposing each other. On the first main surface 2a, electrodes 3 and 4 are provided. The electrode 3 is an example of a "first electrode", while the electrode 4 is an example of a "second electrode". In FIGS. 1A and 1B, plural electrodes 3 are connected to a first busbar 5, while plural electrodes 4 are connected to a second busbar 6. The plural electrodes 3 and the plural electrodes 4 interdigitate each other. The electrodes 3 and 4 preferably have a rectangular or substantially rectangular shape and extend in a longitudinal direction. On the first main surface 2a, an electrode 3 and an adjacent electrode 4 oppose each other in a direction perpendicular or substantially perpendicular to this longitudinal direction. The longitudinal direction of the electrodes 3 and 4 and the direction perpendicular or substantially perpendicular to the longitudinal direction of the electrodes 3 and 4 are both directions intersecting with the thickness direction of the piezoelectric layer 2. It can thus be said that an electrode 3 and an adjacent electrode 4 oppose each other in a direction intersecting with the thickness direction of the piezoelectric layer 2. The electrodes 3 and 4 may extend in a direction perpendicular or substantially perpendicular to the longitudinal direction of the electrodes 3 and 4 shown in FIGS. 1A and 1B. That is, the electrodes 3 and 4 may extend in the extending direction of the first busbar 5 and the second busbar 6 shown in FIGS. 1A and 1B. In this case, the first busbar 5 and the second busbar 6 extend in the extending direction of the electrodes 3 and 4 shown in FIGS. 1A and 1B. Multiple pairs of electrodes 3 and electrodes 4, each pair being formed of an electrode 3, which is connected to one potential, and an electrode 4, which is connected to the other potential, adjacent to each other, are arranged in the direction perpendicular or substantially perpendicular to the longitudinal direction of the electrodes 3 and 4.

"Electrodes 3 and 4 adjacent to each other" refers to, not that the electrodes 3 and 4 directly contact each other, but that the electrodes 3 and 4 are provided with a space therebetween. When electrodes 3 and 4 are adjacent to each other, an electrode connected to a hot electrode and an electrode connected to a ground electrode, including the other electrodes 3 and 4, are not disposed between the electrodes 3 and 4. The number of pairs of the electrodes 3 and 4 are not necessarily an integral number, and may be, for example, 1.5 or 2.5.

The center-to-center distance, that is, the pitch, between the electrodes 3 and 4 is preferably, for example, about 1 μm to about 10 μm. The center-to-center distance between the electrodes 3 and 4 is a distance from the center of the width of the electrode 3 in the direction perpendicular or substantially perpendicular to the longitudinal direction of the electrode 3 to that of the electrode 4. The width of each of the electrodes 3 and 4, that is, the dimension in the direction in which the electrodes 3 and 4 oppose each other, is preferably, for example, about 50 nm to about 1000 nm.

In the present preferred embodiment, since a Z-cut piezoelectric layer is used, the direction perpendicular or substantially perpendicular to the longitudinal direction of the electrodes 3 and 4 is a direction perpendicular or substantially perpendicular to the polarization direction of the piezoelectric layer 2. However, this is not the case if a piezoelectric layer of another cut angle is used as the piezoelectric layer 2. "Being perpendicular" does not necessarily mean being exactly perpendicular, but may mean being substantially perpendicular. For example, the angle between the direction perpendicular to the longitudinal direction of the electrodes 3 and 4 and the polarization direction may be in a range of about 90°±10°.

A support 8 is stacked on the second main surface 2b of the piezoelectric layer 2 with an insulating layer 7 interposed therebetween. The insulating layer 7 and the support 8 are provided in a frame shape and include cavities 7a and 8a, respectively, as shown in FIG. 2. With this structure, an air gap 9 is provided. The air gap 9 is provided not to interfere with the vibration of an excitation region of the piezoelectric layer 2. Thus, the support 8 is stacked on the second main surface 2b with the insulating layer 7 therebetween and is located at a position at which the support 8 does not overlap a region where at least one pair of electrodes 3 and 4 are disposed. The provision of the insulating layer 7 may be omitted. The support 8 can thus be stacked directly or indirectly on the second main surface 2b of the piezoelectric layer 2. The air gap 9 is not restricted to a through-hole passing through the insulating layer 7 and the support 8. The air gap 9 may be constituted by a through-hole provided in the insulating layer 7 and a recessed portion provided in the support 8. In this case, at a position at which the air gap 9 overlaps a region where at least one pair of electrodes 3 and 4 are disposed as viewed from above, the air gap 9 is provided between the piezoelectric layer 2 and the bottom portion of the support 8.

The insulating layer 7 is preferably made of, for example, silicon oxide. Instead of silicon oxide, another suitable insulating material, such as, for example, silicon oxynitride or alumina, may be used. The support 8 is made of, for example, Si. The plane orientation at the Si plane on the side of the piezoelectric layer 2 may be (100) or may be (100), (111). Preferably, high-resistivity Si, such as Si having a resistivity of, for example, about 4Ω or higher, is used. Nevertheless, a suitable insulating material or semiconductor material may be used for the support 8.

The electrodes 3 and 4 and the first and second busbars 5 and 6 are preferably made of a suitable metal or alloy, such as Al or an AlCu alloy, for example. In the present preferred embodiment, the electrodes 3 and 4 and the first and second busbars 5 and 6 have a structure, for example, in which an Al film is stacked on a Ti film. A contact layer made of a material other than Ti may be used.

To drive the acoustic wave device 1, an AC voltage is applied to between the plural electrodes 3 and the plural electrodes 4. More specifically, an AC voltage is applied to between the first busbar 5 and the second busbar 6. With the application of the AC voltage, resonance characteristics based on bulk waves of the thickness shear mode excited in the piezoelectric layer 2 can be exhibited. In the acoustic wave device 1, d/p is preferably set to be, for example, about 0.5 or smaller, where d is the thickness of the piezoelectric layer 2 and p is the center-to-center distance between adjacent first and second electrodes 3 and 4 defining one of multiple pairs of first and second electrodes 3 and 4. This can effectively excite bulk waves of the thickness shear mode and obtain high resonance characteristics. More preferably, for example, d/p is about 0.24 or smaller, in which case, even higher resonance characteristics can be obtained. As in the present preferred embodiment, when the electrodes 3 are provided in the plural and/or the electrodes 4 are provided in the plural, that is, when 1.5 or more pairs of electrodes 3 and 4, each pair being provided by an electrode 3 and an electrode 4, are provided, the center-to-center distance p between adjacent electrodes 3 and 4 is that between adjacent electrodes 3 and 4 of each pair.

The acoustic wave device 1 of the present preferred embodiment is configured as described above. Even if the number of pairs of the electrodes 3 and 4 is reduced to miniaturize the acoustic wave device 1, the Q factor is unlikely to be decreased. The reason for this is as follows. Even if the number of electrode fingers of reflectors on both sides is reduced, only a small propagation loss is incurred. Another reason why the number of electrode fingers can be reduced is that bulk waves of the thickness shear mode are utilized. The difference between Lamb waves used in a known acoustic wave device and bulk waves of the thickness shear mode will be explained below with reference to FIGS. 3A and 3B.

Figure 3A:
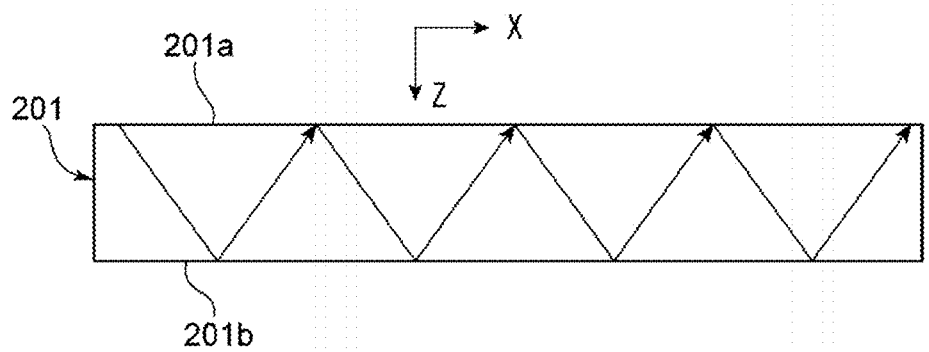
FIG. 3A is a schematic front sectional view explaining a Lamb wave propagating through a piezoelectric film of a known acoustic wave device.

FIG. 3A is a schematic front sectional view explaining a Lamb wave propagating through a piezoelectric film of an acoustic wave device, such as that disclosed in Japanese Unexamined Patent Application Publication No. 2012-257019. A wave propagates through a piezoelectric film 201, as indicated by the arrows. A first main surface 201a and a second main surface 201b of the piezoelectric film 201 oppose each other and the thickness direction in which the first main surface 201a and the second main surface 201b are linked with each other is the Z direction. The X direction is a direction in which the electrode fingers of an IDT electrode are arranged. As shown in FIG. 3A, a Lamb wave propagates in the X direction. Because of the characteristics of a Lamb wave, while the piezoelectric film 201 is entirely vibrated, the Lamb wave propagates in the X direction, and reflectors are disposed on both sides to obtain resonance characteristics. Because of these characteristics, a propagation loss is incurred in the wave. If the number of pairs of electrode fingers is reduced to miniaturize the acoustic wave device, the Q factor is decreased.

Figure 3B:
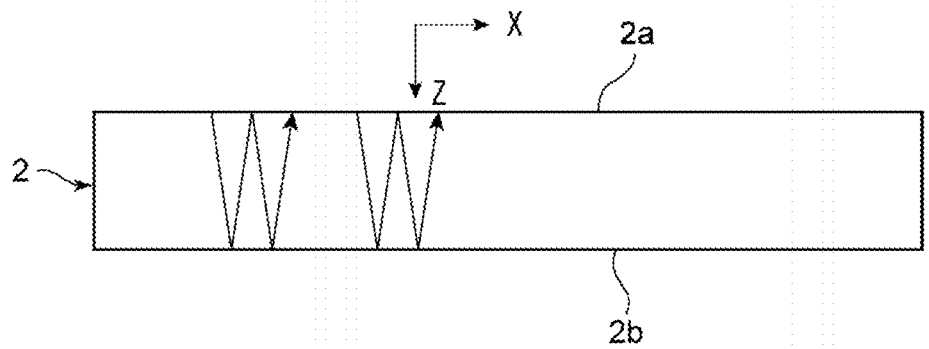
FIG. 3B is a schematic front sectional view explaining a bulk wave of a thickness shear mode which propagates through a piezoelectric layer of an acoustic wave device according to a preferred embodiment of the invention.

In contrast, as shown in FIG. 3B, in the acoustic wave device of the present preferred embodiment, since the vibration displacement direction is the thickness shear direction, a wave propagates and resonates substantially in a direction in which the first main surface 2a and the second main surface 2b are linked with each other, namely, substantially in the Z direction. That is, the X-direction components of the wave are much smaller than the Z-direction components. The resonance characteristics are obtained as a result of the wave propagating in the Z direction. Hence, reducing the number of electrode fingers of the reflectors does not cause a propagation loss. Even if the number of pairs of the electrodes 3 and 4 is reduced to implement an even smaller size of the acoustic wave device 1, the Q factor is unlikely to be decreased.

Figure 4:
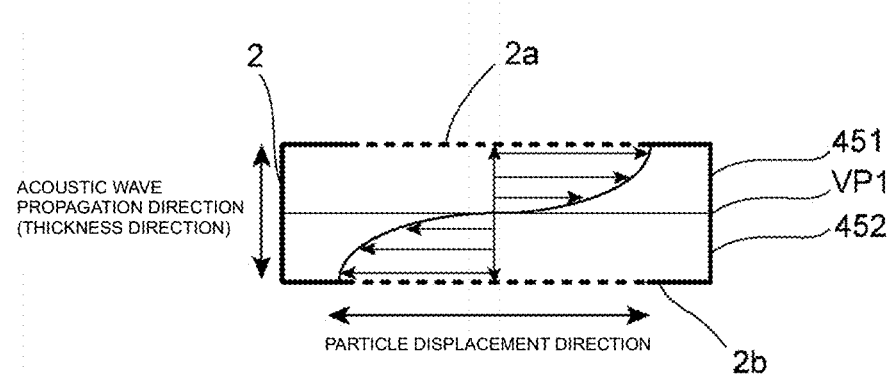
FIG. 4 illustrates amplitude directions of a bulk wave of the thickness shear mode.

Regarding the amplitude direction of a bulk wave of the thickness shear mode, as shown in FIG. 4, the amplitude direction in a first region 451, which defines an excitation region of the piezoelectric layer 2, and that in a second region 452, which also defines the excitation region, become opposite. FIG. 4 schematically illustrates a bulk wave generated when a voltage is applied to between the electrode 3 and the electrode 4 so that the potential of the electrode 4 becomes higher than that of the electrode 3. The first region 451, which is a portion of the excitation region, is a region between a virtual plane VP1 and the first main surface 2a. The virtual plane VP1 is perpendicular to the thickness direction of the piezoelectric layer 2 and divides the piezoelectric layer 2 into two regions. The second region 452, which is a portion of the excitation region, is a region between the virtual plane VP1 and the second main surface 2b.

As discussed above, in the acoustic wave device 1, at least one pair of electrodes 3 and 4 is provided. Since a wave does not propagate through the piezoelectric layer 2 of the acoustic wave device 1 in the X direction, plural pairs of electrodes 3 and 4 are not necessary. That is, the provision of at least one pair of electrodes is sufficient.

In one example, the electrode 3 is an electrode connected to a hot potential, while the electrode 4 is an electrode connected to a ground potential. Conversely, the electrode 3 may be connected to a ground potential, while the electrode 4 may be connected to a hot potential. In the present preferred embodiment, at least one pair of electrodes are connected to a hot potential and a ground potential, and more specifically, one electrode defining this pair is an electrode connected to a hot potential, and the other electrode is an electrode connected to a ground potential. No floating electrode is provided.

Figure 5:
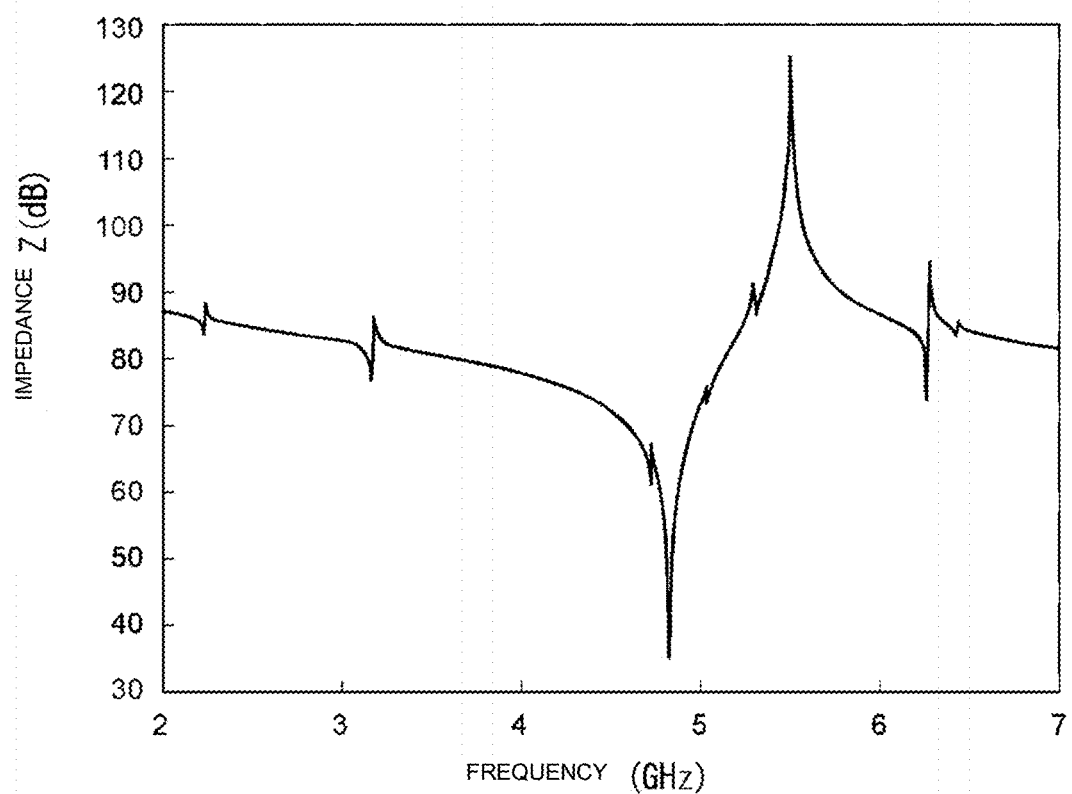
FIG. 5 is a graph illustrating the resonance characteristics of the acoustic wave device according to the first preferred embodiment of the invention.

FIG. 5 is a graph illustrating the resonance characteristics of the acoustic wave device according to the first preferred embodiment of the invention. The parameters of the acoustic wave device 1 that has obtained the resonance characteristics shown in FIG. 5 are as follows.

The piezoelectric layer 2 is LiNbO₃ having, for example, the Euler angles of (0°, 0°, 90° and a thickness of about 400 nm. The length of a region where the electrodes 3 and 4 overlap each other as viewed from a direction perpendicular to the longitudinal direction of the electrodes 3 and 4, that is, the length of the excitation region is, for example, about 40 µm. The number of pairs of electrodes 3 and 4 is 21. The center-to-center distance between electrodes is, for example, about 3 µm. The width of the electrodes 3 and 4 is, for example, about 500 nm. d/p is, for example, about 0.133.

The insulating layer 7 is a silicon oxide film having a thickness of, for example, about 1 µm.

The support 8 is made of, for example, Si.

The length of the excitation region is a dimension of the excitation region in the longitudinal direction of the electrodes 3 and 4.

In the present preferred embodiment, the electrode-to-electrode distance of an electrode pair constituted by electrodes 3 and 4 was set to be all equal among plural pairs. That is, the electrodes 3 and 4 were disposed at equal or substantially equal pitches.

As is seen from FIG. 5, despite that no reflectors are disposed, high resonance characteristics having a fractional bandwidth of, for example, about 12.5% are obtained.

In the present preferred embodiment, as stated above, d/p is, for example, about 0.5 or smaller, and more preferably, d/p is, for example, about 0.24 or smaller, where d is the thickness of the piezoelectric layer 2 and p is the center-to-center distance between the electrodes 3 and 4. This will be explained below with reference to FIG. 6.

Figure 6:
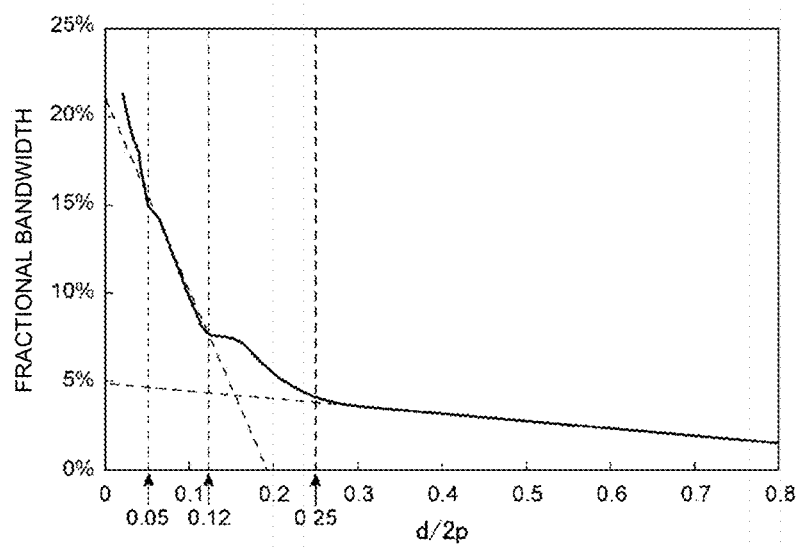
FIG. 6 is a graph illustrating the relationship between d/2 p, where p is the center-to-center distance between adjacent electrodes and d is the thickness of the piezoelectric layer, and the fractional bandwidth of each of acoustic wave devices as resonators.

Plural acoustic wave devices were made in a manner similar to the acoustic wave device which has obtained the resonance characteristics shown in FIG. 5, except that d/2 p was varied among these plural acoustic wave devices. FIG. 6 is a graph illustrating the relationship between d/2 p and the fractional bandwidth of each of the plural acoustic wave devices as resonators.

As is seen from FIG. 6, when d/2 p exceeds about 0.25, that is, for example, d/p> about 0.5, the fractional bandwidth remains less than about 5% even if d/p is changed. In contrast, when d/2p≤ about 0.25, that is, when d/p≤ about 0.5, the fractional bandwidth can be improved to about 5% or higher even if d/p is changed in this range. It is thus possible to form a resonator having a high coupling coefficient. When d/2 p is about 0.12 or smaller, that is, when d/p is about 0.24 or smaller, the fractional bandwidth can be improved to about 7% or higher. Additionally, if d/p is adjusted in this range, a resonator having an even higher fractional bandwidth can be obtained. It is thus possible to form a resonator having an even higher coupling coefficient. Hence, as in the second invention of the present application, it has been validated that, as a result of setting d/p to be about 0.5 or smaller, a resonator having a high coupling coefficient based on bulk waves of the thickness shear mode can be provided.

As stated above, p is the center-to-center distance between adjacent electrodes 3 and 4.

Figure 13:
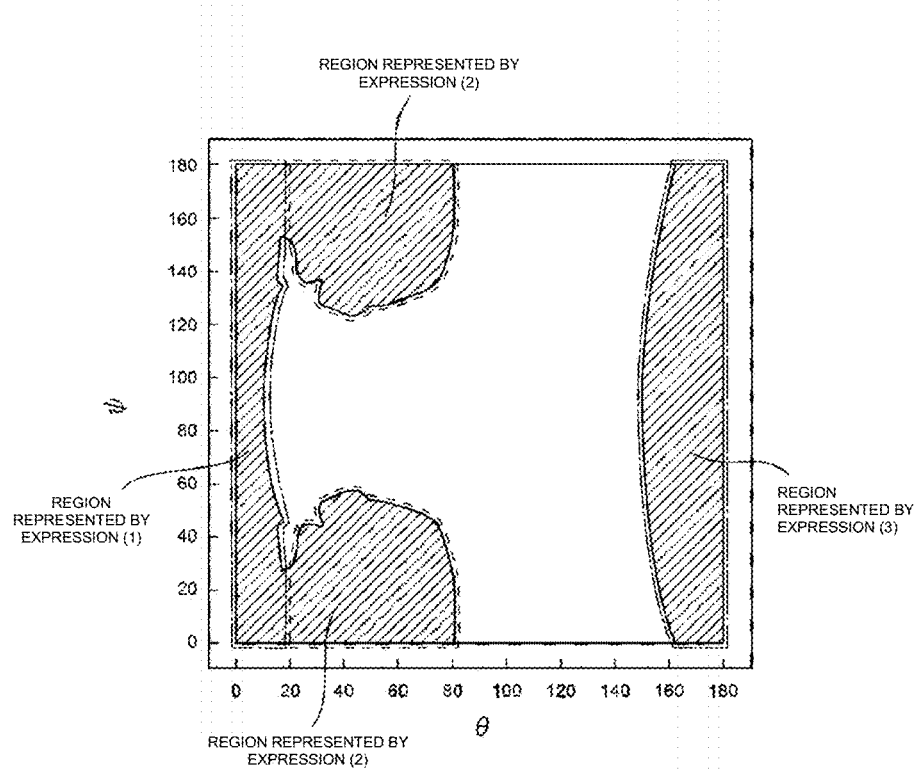
FIG. 13 is a diagram illustrating a fractional bandwidth map with respect to the Euler angles (0°, θ, ψ) of LiNbO$_3$ in a case in which d/p is approached as close to 0 as possible.

FIG. 13 is a diagram illustrating a fractional bandwidth map with respect to the Euler angles (0°, θ, ψ) of LiNbO₃ in a case in which d/p is approached as close to 0 as possible. The hatched portions in FIG. 13 are regions where a fractional bandwidth of at least 5% or higher is obtained.

The ranges of the regions can be approximated to the ranges represented by the following expressions (1), (2), and (3).

$(0°±10°, 0°$ to $20°$, a desirable angle of $\psi)$   Expression (1)

$(0°±10°, 20°$ to $80°, 0°$ to $60°(1-(\theta-50)^2/900)^{1/2})$ or $(0°±10°, 20°$ to $80°, [180°-60°(1-(\theta-50)^2/900)^{1/2}]$ to $180°$   Expression (2)

$(0°±10°, [180°-30°(1-(\psi-90)^2/8100)^{1/2}]$ to $180°]$ to $180°$, a desirable angle of $\psi)$   Expression (3)

When the Euler angles are in the range represented by the above-described expression (1), (2), or (3), a sufficiently wide fractional bandwidth can be obtained, which is desirable.

Regarding the thickness d of the piezoelectric layer, if the piezoelectric layer 2 has variations in the thickness, the averaged thickness value may be used.

In the acoustic wave device according to the invention, when the intersecting width, which is discussed below, is, for example, about 4.6 p or greater, ripples caused by unwanted modes other than bulk waves of the thickness shear mode can be effectively reduced or prevented. This will be explained below.

The intersecting width is a dimension of a region, which extends in the extending direction of the first and second electrodes, where the first and second electrodes oppose each other. That is, in FIG. 1B, the dimension of a region, which extends in the extending direction of the electrodes 3 and the electrodes 4, where an electrode 3, which serves as the first electrode, and an electrode 4, which serves as the second electrode, oppose each other, that is, a region where the electrodes 3 and 4 overlap each other in the X direction, is set to be an intersecting width K. When the intersecting width K is about 4.6 p or greater as discussed above, where p is the repeating pitch of the electrodes 3 and 4 and is the center-to-center distance between the electrode finger of the electrode 3 and that of the electrode 4, ripples caused by unwanted waves can be suppressed. Acoustic wave devices were made by using design parameters similar to those of the acoustic wave device 1 of the first preferred embodiment that has obtained the resonance characteristics in FIG. 5, except that the electrode finger pitch p was set to about 3.25 µm and the respective intersecting widths K of the acoustic wave devices were set to about 0.31 p, about 0.92 p, about 1.54 p, and about 3.08 p. The impedance-frequency characteristics, which are characteristics of these acoustic wave devices as resonators, are shown in FIG. 7.

Figure 7:
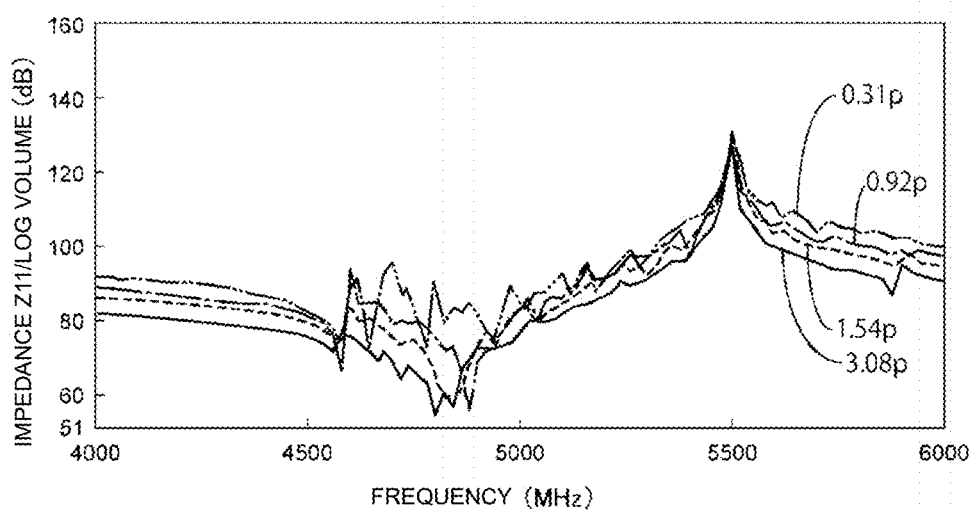
FIG. 7 is a graph illustrating the impedance-frequency characteristics, which are characteristics of acoustic wave devices as resonators, in a case in which the intersecting widths of the respective acoustic wave devices are about 0.31 p, about 0.92 p, about 1.54 p, and about 3.08 p.

As is seen from FIG. 7, in all the resonators having the respective interdigital widths K of about 0.31 p, about 0.92 p, about 1.54 p, and about 3.08 p, numerous ripples caused by unwanted waves are observed at and near the resonant frequency.

Acoustic wave devices were made by using design parameters similar to those of the acoustic wave device that has obtained the resonance characteristics in FIG. 5, except that the respective intersecting widths K of the acoustic wave devices were set to about 3.08 p, about 4.62 p, about 6.15 p, about 7.69 p, and about 9.23 p. The impedance-frequency characteristics, which are characteristics of these acoustic wave devices as resonators, are shown in FIG. 8.

Figure 8:
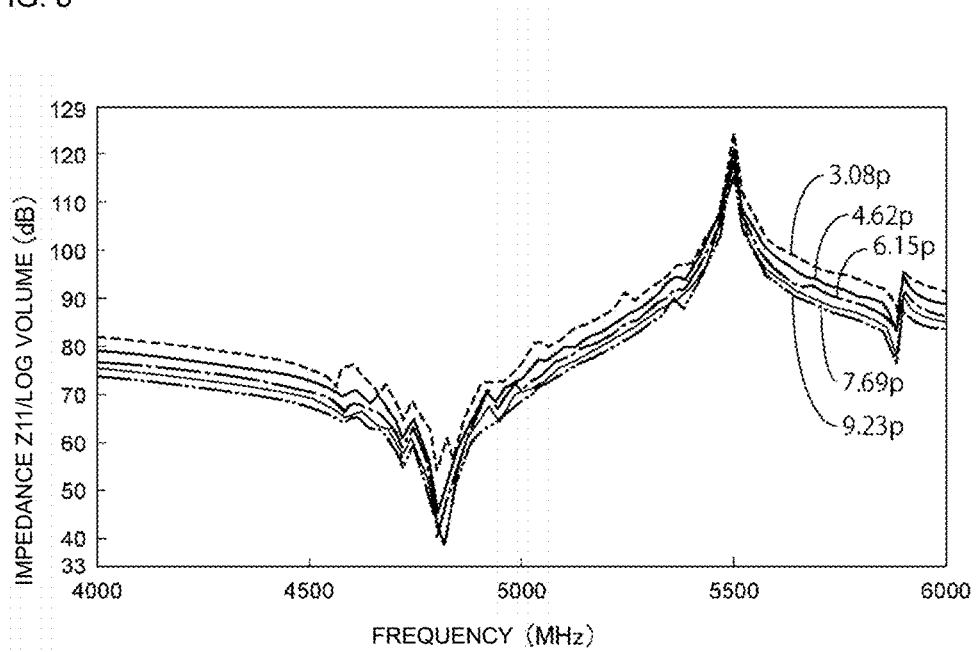
FIG. 8 is a graph illustrating the impedance-frequency characteristics, which are characteristics of acoustic wave devices as resonators, in a case in which the intersecting widths of the respective acoustic wave devices are about 3.08 p, about 4.62 p, about 6.15 p, about 7.69 p, and about 9.23 p.

As is seen from FIG. 8, when the interdigital width K is about 3.08 p, many ripples due to unwanted waves are observed at and near the resonant frequency, as in the resonance characteristics in FIG. 7. In contrast, when the interdigital width K is 4.6 p or greater, the above-described ripples are decreased and high resonance characteristics are obtained.

In the present invention, therefore, it is necessary that the interdigital width K be about 4.6 p or greater.

While a large interdigital width K is desirable to suppress ripples caused by unwanted waves, an excessively large interdigital width K increases a loss. It is thus desirable that the interdigital width K be 9.2 p or smaller to regulate a loss.

It is assumed that the dimension of the first busbar 5 in the extending direction of the electrode 3 and that of the second busbar 6 in the extending direction of the electrode 4 are each a busbar width. In the acoustic wave device 1, this busbar width is preferably about 9.23 p or smaller.

Figure 9A:
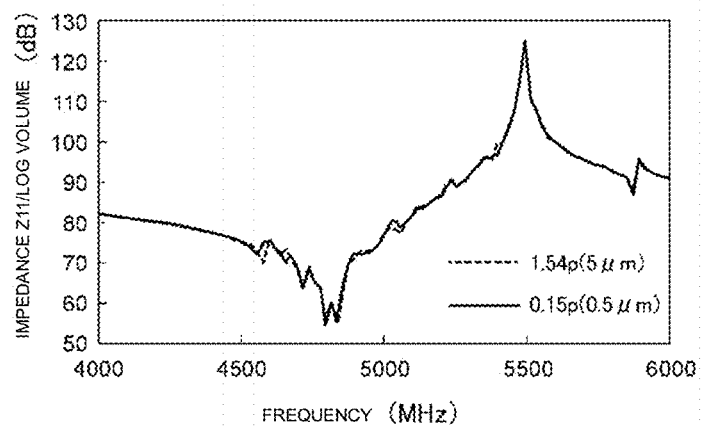
FIGS. 9A and 9B are graphs illustrating the impedance-frequency characteristics, which are characteristics of acoustic wave devices as resonators, in a case in which the busbar widths of the respective acoustic wave devices are about 1.54 p, about 0.15 p, and about 0.03 p.
Figure 9B:
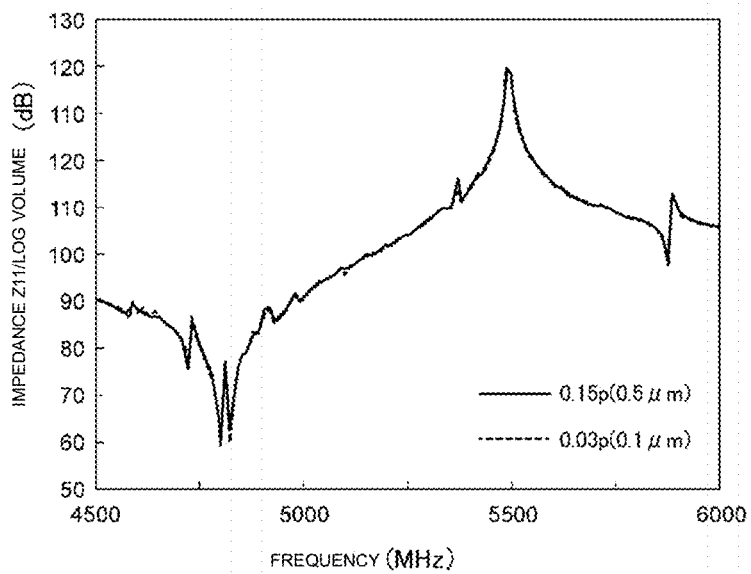

To reduce the size of an acoustic wave device, the busbar width of the first and second busbars 5 and 6 is preferably small. FIGS. 9A and 9B are graphs illustrating the impedance-frequency characteristics, which are characteristics of acoustic wave devices as resonators, in a case in which the busbar widths of the first and second busbars 5 and 6 of the respective acoustic wave devices are about 1.54 p (about 5 μm), about 0.15 p (about 0.5 μm), and about 0.03 p (about 0.1 μm). The other design parameters are the same as or similar to those of the acoustic wave devices exhibiting the resonance characteristics shown in FIGS. 7 and 8.

As is seen from FIGS. 9A and 9B, even when the busbar width is reduced from about 1.54 p to about 0.15 p, the resonance characteristics are the same or substantially the same.

Even when the busbar width is reduced from about 0.15 p to about 0.03 p, the resonance characteristics are substantially the same. It is thus validated that reducing of the busbar width until about 0.03 p does not influence the characteristics. Although an excessively large busbar width is unlikely to degrade the resonance characteristics, it increases the dimensions of an acoustic wave device. To reduce the size of the acoustic wave device, the busbar width is preferably, for example, about 9.23 p or smaller.

As discussed above, the acoustic wave device according to the first and second inventions of the present application achieves high resonance characteristics without the need to provide reflectors and can thus obtain a high Q factor even if the acoustic wave device is reduced in size. As discussed above, the acoustic wave device according to the invention can also effectively reduce or prevent ripples caused by unwanted waves. Other preferred embodiments and modified examples of the invention will be described below.

Figure 10:
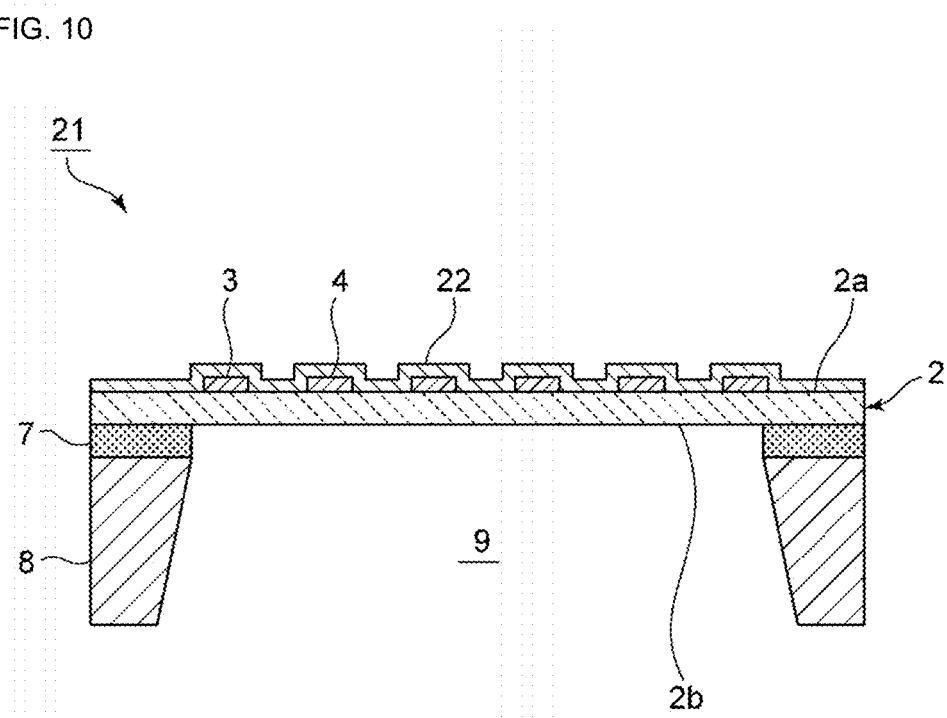
FIG. 10 is a front sectional view of an acoustic wave device according to a second preferred embodiment of the present invention.

FIG. 10 is a front sectional view of an acoustic wave device according to a second preferred embodiment. In an acoustic wave device 21, a protection film 22 is stacked on the first main surface 2a of the piezoelectric layer 2 so as to cover at least a pair of electrodes 3 and 4. As the protection film 22, a suitable insulating material, such as silicon oxide or silicon oxynitride, can be used. The protection film 22 also covers a gap region between the electrodes 3 and 4, but it may partially cover the gap region.

Figure 11:
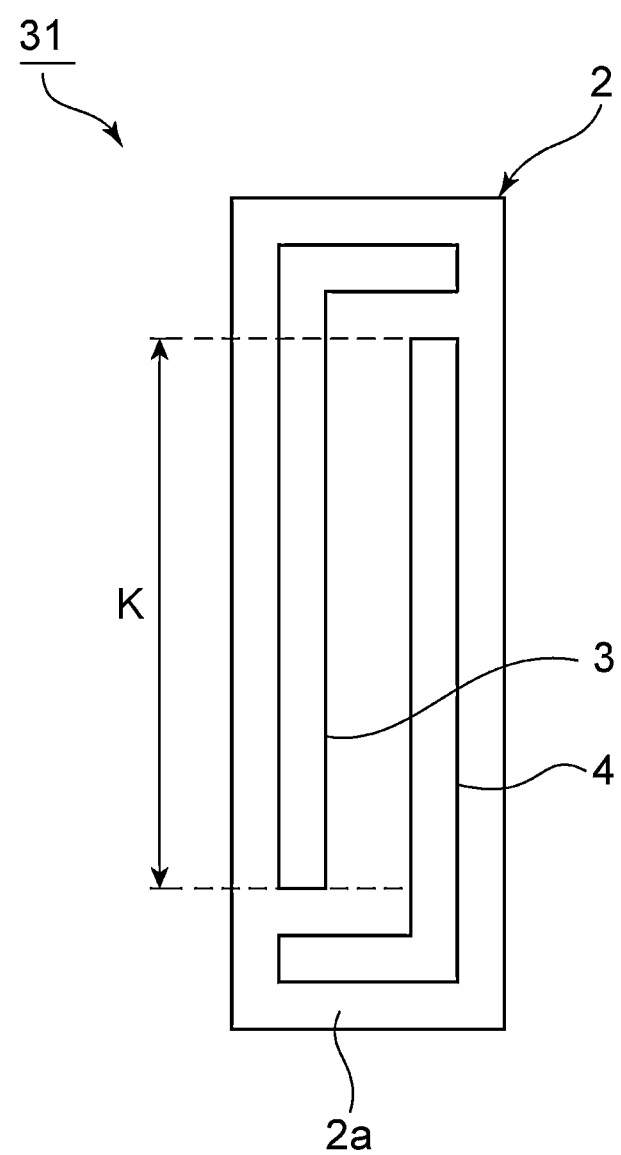
FIG. 11 is a plan view of an acoustic wave device according to a third preferred embodiment of the present invention.

FIG. 11 is a plan view of an acoustic wave device according to a third preferred embodiment. In an acoustic wave device 31, a pair of electrodes 3 and 4 is disposed on the first main surface 2a of the piezoelectric layer 2. K in FIG. 11 indicates the intersecting width. As discussed above, in an acoustic wave device of the present invention, the number of pairs of electrodes may be 1. In this case, too, bulk waves of the thickness shear mode can be effectively excited if d/p is about 0.5 or smaller.

Figure 12:
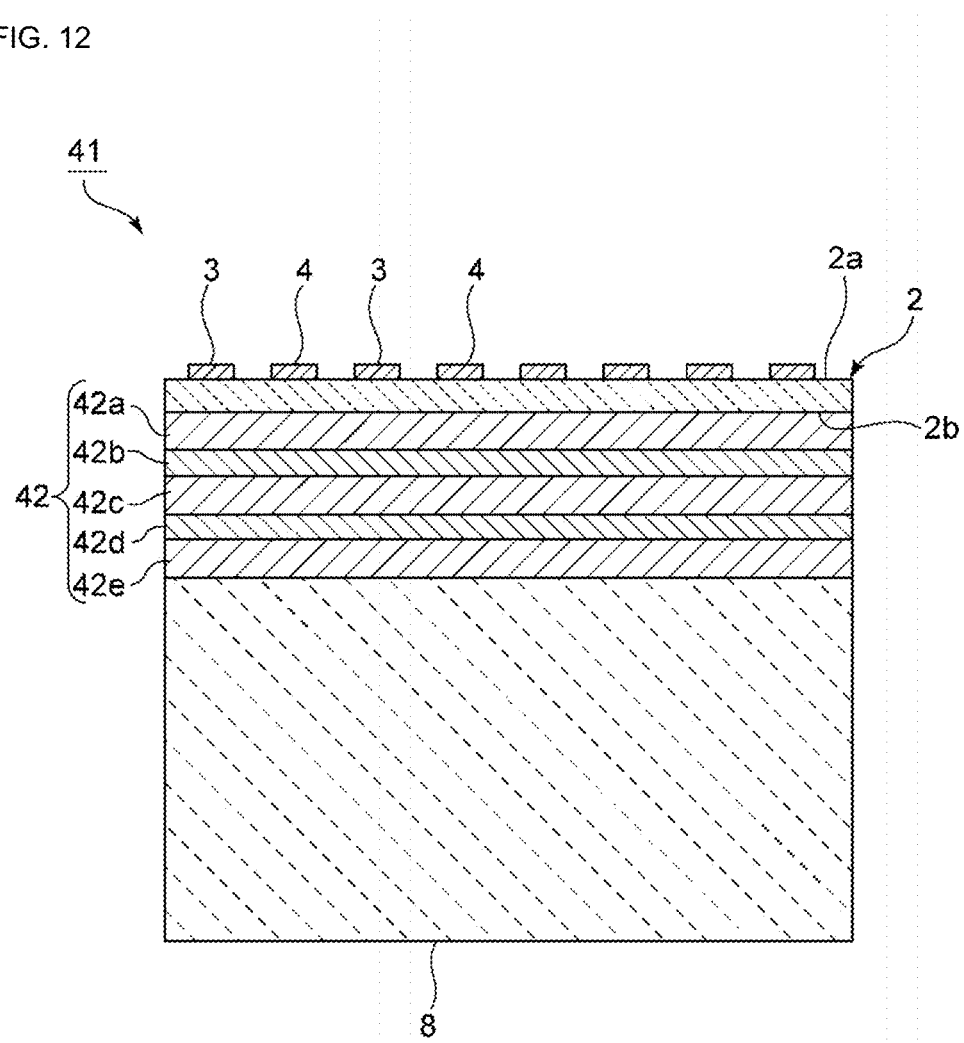
FIG. 12 is a front sectional view of an acoustic wave device according to a fourth preferred embodiment of the present invention.

FIG. 12 is a front sectional view of an acoustic wave device according to a fourth preferred embodiment. In an acoustic wave device 41, a multilayer acoustic film 42 is stacked on the second main surface 2b of the piezoelectric layer 2. The multilayer acoustic film 42 has a multilayer structure defined by low acoustic impedance layers 42a, 42c, and 42e having a relatively low acoustic impedance and high acoustic impedance layers 42b and 42d having a relatively high acoustic impedance. The use of the multilayer acoustic film 42 can trap bulk waves of the thickness shear mode within the piezoelectric layer 2 without forming the air gap 9 in the acoustic wave device 1. The acoustic wave device 41 can also obtain resonance characteristics based on bulk waves of the thickness shear mode if d/p is set to be about 0.5 or smaller. In the multilayer acoustic film 42, the number of low acoustic impedance layers 42a, 42c, and 42e and the number of high acoustic impedance layers 42b and 42d are not limited to particular numbers. Any number of low acoustic impedance layers and any number of high acoustic impedance layers may be used if at least one of high acoustic impedance layers, such as the high acoustic impedance layers 42b and 42d, is separated from the piezoelectric layer 2 farther than a low acoustic impedance layer, such as the low acoustic impedance layers 42a, 42c, or 42e, is.

The low acoustic impedance layers 42a, 42c, and 42e and the high acoustic impedance layers 42b and 42d may be made of any suitable material if the above-described acoustic impedance relationship is satisfied. For instance, examples of the material for the low acoustic impedance layers 42a, 42c, and 42e are silicon oxide and silicon oxynitride, while examples of the material for the high acoustic impedance layers 42b and 42d are alumina, silicon nitride, and a metal.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric layer made of lithium niobate or lithium tantalate; and
   a first electrode and a second electrode that oppose each other in a direction intersecting with a thickness direction of the piezoelectric layer; wherein
   the acoustic wave device utilizes a bulk wave of a thickness shear mode; and
   an intersecting width is about 4.6 p or greater, where p is a center-to-center distance between the first electrode and the second electrode, the intersecting width being a dimension of a region where the first electrode and the second electrode oppose each other, a direction of the dimension being an extending direction of the first and second electrodes.

2. An acoustic wave device comprising:
   a piezoelectric layer made of lithium niobate or lithium tantalate; and
   a first electrode and a second electrode that oppose each other in a direction intersecting with a thickness direction of the piezoelectric layer; wherein
   the first electrode and the second electrode are electrodes adjacent to each other;
   d/p is about 0.5 or smaller, where d is a thickness of the piezoelectric layer and p is a center-to-center distance between the first electrode and the second electrode; and
   an intersecting width is about 4.6 p or greater, the intersecting width being a dimension of a region where the first electrode and the second electrode oppose each other, a direction of the dimension being an extending direction of the first and second electrodes.

3. The acoustic wave device according to claim 1, wherein the intersecting width is about 9.2 p or smaller.

4. The acoustic wave device according to claim 1, further comprising:
a first busbar to which the first electrode is connected; and
a second busbar to which the second electrode is connected.

5. The acoustic wave device according to claim 4, wherein a busbar width is about 9.23 p or smaller, the busbar width being a dimension of the first busbar in the extending direction of the first electrode and a dimension of the second busbar in the extending direction of the second electrode.

6. The acoustic wave device according to claim 1, wherein the first electrode and the second electrode have a longitudinal direction, and the first electrode and the second electrode oppose each other in a direction perpendicular or substantially perpendicular to the longitudinal direction.

7. The acoustic wave device according to claim 1, further comprising:
a support that is directly or indirectly stacked on a side of the piezoelectric layer opposite a side on which the first and second electrodes are located, the support being stacked at a position at which the support does not overlap a region where the first and second electrodes are located.

8. The acoustic wave device according to claim 7, wherein, on a side of the piezoelectric layer opposite to the side on which the first and second electrodes are provided, an air gap is located in a region where the support is not provided.

9. The acoustic wave device according to claim 1, further comprising:
a multilayer acoustic film stacked on a side of the piezoelectric layer opposite of a side on which the first and second electrodes are located; wherein
the multilayer acoustic film includes a multilayer structure defined by a low acoustic impedance layer having a relatively low acoustic impedance and a high acoustic impedance layer having a relatively high acoustic impedance.

10. The acoustic wave device according to claim 1, wherein the first electrode and the second electrode oppose each other on an identical main surface of the piezoelectric layer.

11. The acoustic wave device according to claim 2, wherein the intersecting width is about 30 p or smaller.

12. The acoustic wave device according to claim 2, further comprising:
a first busbar to which the first electrode is connected; and
a second busbar to which the second electrode is connected.

13. The acoustic wave device according to claim 12, wherein a busbar width is about 9.23 p or smaller, the busbar width being a dimension of the first busbar in the extending direction of the first electrode and a dimension of the second busbar in the extending direction of the second electrode.

14. The acoustic wave device according to claim 2, wherein the first electrode and the second electrode have a longitudinal direction, and the first electrode and the second electrode oppose each other in a direction perpendicular or substantially perpendicular to the longitudinal direction.

15. The acoustic wave device according to claim 2, further comprising:
a support that is directly or indirectly stacked on a side of the piezoelectric layer opposite a side on which the first and second electrodes are located, the support being stacked at a position at which the support does not overlap a region where the first and second electrodes are located.

16. The acoustic wave device according to claim 15, wherein, on a side of the piezoelectric layer opposite to the side on which the first and second electrodes are provided, an air gap is located in a region where the support is not provided.

17. The acoustic wave device according to claim 2, further comprising:
a multilayer acoustic film stacked on a side of the piezoelectric layer opposite of a side on which the first and second electrodes are located; wherein
the multilayer acoustic film includes a multilayer structure defined by a low acoustic impedance layer having a relatively low acoustic impedance and a high acoustic impedance layer having a relatively high acoustic impedance.

18. The acoustic wave device according to claim 2, wherein the first electrode and the second electrode oppose each other on an identical main surface of the piezoelectric layer.

19. The acoustic wave device according to claim 1, wherein a total thickness of the piezoelectric layer is about 40 nm to about 1000 nm.

20. The acoustic wave device according to claim 2, wherein a total thickness of the piezoelectric layer is about 40 nm to about 1000 nm.

* * * * *